(12) United States Patent
Cho et al.

(10) Patent No.: US 11,855,052 B2
(45) Date of Patent: Dec. 26, 2023

(54) LED DISPLAY APPARATUS HAVING MICRO LED MODULE

(71) Applicant: SEOUL VIOSYS CO., LTD., Gyeonggi-do (KR)

(72) Inventors: Dae Sung Cho, Gyeonggi-do (KR); So Ra Lee, Gyeonggi-do (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 361 days.

(21) Appl. No.: 17/153,376

(22) Filed: Jan. 20, 2021

(65) Prior Publication Data
US 2021/0225821 A1  Jul. 22, 2021

Related U.S. Application Data

(60) Provisional application No. 63/055,002, filed on Jul. 22, 2020, provisional application No. 62/964,265, filed on Jan. 22, 2020.

(51) Int. Cl.
| | |
|---|---|
| *H01L 25/13* | (2006.01) |
| *H01L 33/54* | (2010.01) |
| *H01L 33/62* | (2010.01) |
| *G09F 9/33* | (2006.01) |
| *H01L 25/075* | (2006.01) |

(52) U.S. Cl.
CPC .............. *H01L 25/13* (2013.01); *H01L 33/54* (2013.01); *H01L 33/62* (2013.01)

(58) Field of Classification Search
CPC ......... H01L 33/62; H01L 33/54; H01L 25/13; H01L 25/075; G09F 9/33; B41J 2/455; B41J 2/44; B41J 2/45
See application file for complete search history.

(56) References Cited

U.S. PATENT DOCUMENTS 9,935,153 B1   4/2018   Jung et al.

FOREIGN PATENT DOCUMENTS

| CN | 111508935 B | * | 3/2022 | ............ G09F 9/301 |
|---|---|---|---|---|
| JP | 05042718 A | | 2/1993 | |
| KR | 100783480 B1 | | 12/2007 | |
| KR | 1020120125325 A | | 11/2012 | |

(Continued)

OTHER PUBLICATIONS

International Search Report for International Application No. PCT/KR2021/000779, dated Apr. 12, 2021, English Translation, 2 pages.

(Continued)

*Primary Examiner* — Antonio B Crite

(74) *Attorney, Agent, or Firm* — Perkins Coie LLP

(57) ABSTRACT

A display apparatus includes a display substrate, first micro LED modules arranged on the display substrate, and at least one second micro LED module disposed between the first micro LED modules. Each of the first micro LED modules includes a first substrate, and micro LEDs disposed on the first substrate, the second micro LED module includes a second substrate, and micro LEDs disposed on the second substrate. The first substrate includes a lower body and a top plate located on the lower body. The lower body is recessed from an edge of the top plate, and the second micro LED module is disposed between recessed lower bodies of adjacent first micro LED modules.

20 Claims, 10 Drawing Sheets

(56) References Cited

FOREIGN PATENT DOCUMENTS

| KR | 1020180075827 A | 7/2018 |
|----|-----------------|--------|
| KR | 1020180118488 A | 10/2018 |
| KR | 1020190008746 A | 1/2019 |
| KR | 1020190039313 A | 4/2019 |
| KR | 1020190109222 A | 9/2019 |
| KR | 1020190119438 A | 10/2019 |
| WO | 2017150910 A1  | 9/2017 |
| WO | 2019014036 A1  | 1/2019 |

OTHER PUBLICATIONS

International Search Report for corresponding International Application No. PCT/KR2021/000848, dated May 6, 2021, English Translation, 5 pages.
International Search Report for corresponding International Application No. PCT/KR2021/000827, dated Apr. 20, 2021, English Translation, 2 pages.

* cited by examiner

RELATED ART

RELATED ART

LED DISPLAY APPARATUS HAVING MICRO LED MODULE

CROSS-REFERENCE OF RELATED APPLICATIONS AND PRIORITY

The present application is a Non-provisional Application which claims priority to the benefit of U.S. Provisional Application Nos. 62/964,265 filed Jan. 22, 2020 and 63/055,002 filed Jul. 22, 2020, the disclosures of which are incorporated by reference their entirety.

TECHNICAL FIELD

The present disclosure relates to an LED display apparatus, and more particularly, to an LED display apparatus having tile-shaped micro LED modules.

BACKGROUND

As an inorganic light source, light emitting diodes are for use in various fields including displays, vehicular lamps, general lighting, and the like. With various advantages such as long lifespan, low power consumption, and rapid response, light emitting diodes have been replacing existing light sources.

For example, a display apparatus realizes various colors through mixture of blue, green and red light. In order to realize various images, the display apparatus includes a plurality of pixels, each of which has subpixels corresponding to blue, green and red light, respectively. A color of a certain pixel is determined based on the colors of the sub-pixels so that images can be realized through combination of such pixels.

Light emitting diodes have been used as backlight light sources in display apparatuses. However, LED displays may directly realize images using the light emitting diodes.

As LEDs can emit various colors depending upon materials thereof, it is possible to provide a display apparatus by arranging individual LED chips emitting blue, green and red light on a two-dimensional plane. However, when one LED chip is arranged in each sub-pixel, the number of LED chips may be increased, which may result in a longer time for a mounting process during manufacture. Accordingly, stacked light emitting devices may reduce the time required for the mounting process. For example, by manufacturing a light emitting device in which a red LED, a blue LED, and a green LED are stacked, red, blue, and green light may be implemented using one light emitting device. Accordingly, one pixel that emits red, blue, and green light may be provided with a single light emitting device, thereby reducing the number of light emitting devices mounted on the display apparatus.

FIG. 1 is a plan view illustrating an LED display apparatus 10 according to the related art. Referring to FIG. 1, the display apparatus 10 includes a display substrate 11 and light emitting devices R, G, and B. Each of the light emitting devices R, G, and B is a micro LED, which has a form factor of about 10,000 µm$^2$ or less, which is available in the art.

Each of red, green, and blue light emitting devices R, G, and B is a sub-pixel, and sub-pixels constitute one pixel P. A plurality of pixels P is arranged on the display substrate 11 and an image is implemented with these pixels P. The display substrate 11 is a substrate corresponding to an entire screen of the display apparatus, and in some embodiments, millions to tens of millions of micro LEDs are mounted on the display substrate 11.

However, due to the small form factor of micro LEDs, it is difficult to handle micro LEDs, and thus, it is not easy to transfer and mount millions to tens of millions of micro LEDs on a display panel. Moreover, the micro LEDs may be damaged by an external impact, and thus, defects may be formed in the micro LEDs during transportation.

Accordingly, when all of the micro LEDs are mounted on the display substrate 11 corresponding to one screen, a manufacturing yield of the display apparatus may not be favorable. Moreover, since a large number of light emitting devices R, G, and B have to be mounted on the large-area display substrate 11, workability is poor.

These drawbacks may occur for a pixel configured to be using a stacked light emitting device. To solve these drawbacks, a tile-shaped micro LED module may be used.

FIG. 2 is a plan view illustrating a display apparatus 20 including micro LED modules according to the related art, and FIG. 3 is a schematic partial cross-sectional view taken along line A-A' of FIG. 2.

Referring to FIG. 2, the display apparatus 20 includes a display substrate 21 and tile-shaped micro LED modules T. The micro LED modules T include light emitting devices R, G, and B, and are arranged on the display substrate 21.

The micro LED module T may include a plurality of pixels, and these modules T may be mounted on the display substrate 21 to form an entire screen. Accordingly, instead of mounting all of the light emitting devices R, G, and B on the display substrate 21, the light emitting devices R, G, and B may be mounted on a plurality of micro LED modules T, and the display apparatus 20 may be provided by mounting the LED modules T on the display substrate 21.

As the display apparatus 20 may be manufactured by selecting favorable LED modules T, a manufacturing yield of the display apparatus 20 may be improved, and workability may also be improved.

However, when the display apparatus 20 is manufactured by tiling the plurality of micro LED modules T, the micro LED modules T are spaced apart from one another in consideration of tolerance generated when the micro LED modules T are manufactured and mounted, as indicated by a dotted line in FIG. 3.

As the micro LED modules T are spaced apart, a space between them may appear on the screen as, for example, a linear defect. This linear defect can be observed not only in an idle state in which an image is not displayed but also when an image is displayed.

SUMMARY

Exemplary embodiments provide a display apparatus capable of reducing linear defects observed when micro LED modules are arranged using a tiling technique.

The exemplary embodiments also provide a micro LED module of a novel structure.

An exemplary embodiment provides a display apparatus. The display apparatus includes a display substrate, first micro LED modules arranged on the display substrate, and at least one second micro LED module disposed between the first micro LED modules. Each of the first micro LED module includes a first substrate and micro LEDs disposed on the first substrate, the second micro LED module includes a second substrate, and micro LEDs disposed on the second substrate. The first substrate includes a lower body and a top plate located on the lower body. The lower body is recessed from an edge of the top plate, and the second micro LED module is disposed between recessed lower bodies of adjacent second micro LED modules.

An exemplary embodiment provides a micro LED module, The micro LED module includes a first substrate and micro LEDs disposed on the first substrate. The first substrate includes a lower body and a top plate disposed on the lower body. The lower body is recessed from an edge of the top plate.

DETAILED DESCRIPTION OF EMBODIMENTS

Figure 1:
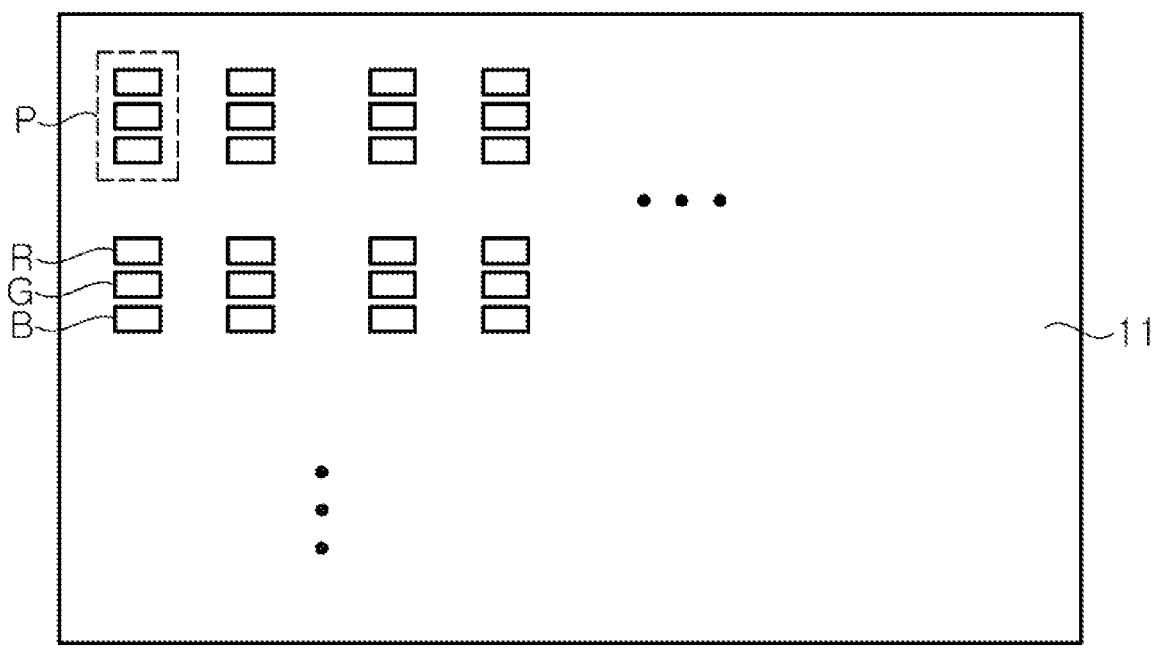
FIG. 1 is a plan view illustrating an LED display apparatus according to the related art.
Figure 2:
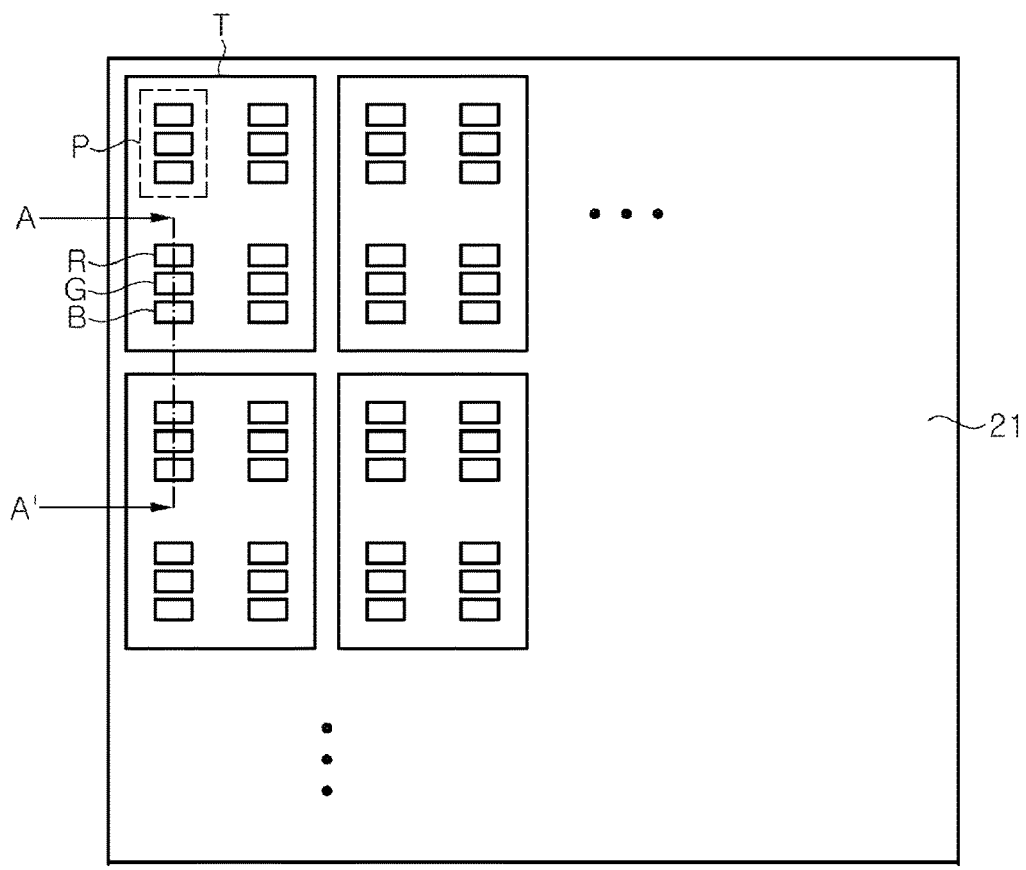
FIG. 2 is a plan view illustrating a display apparatus including micro LED modules according to the related art.
Figure 3:
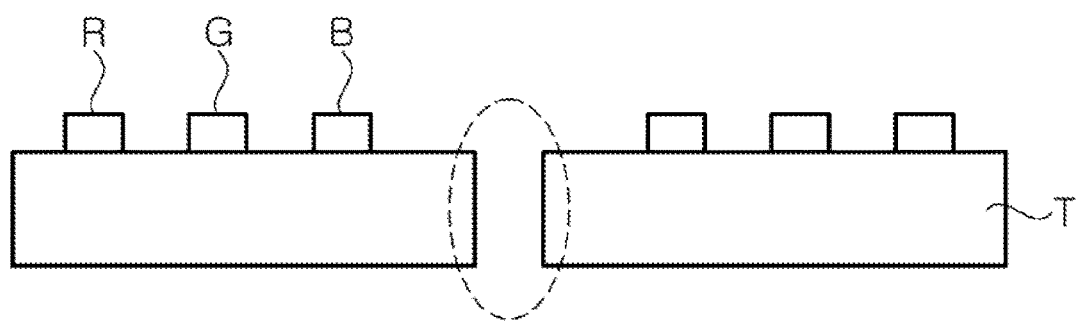
FIG. 3 is a schematic partial cross-sectional view taken along line A-A' of FIG. 2.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of devices can be exaggerated for clarity and descriptive purposes. When an element or layer is referred to as being "disposed above" or "disposed on" another element or layer, it can be directly "disposed above" or "disposed on" the other element or layer or intervening devices or layers can be present. Throughout the specification, like reference numerals denote like devices having the same or similar functions.

An exemplary embodiment provides a display apparatus. The display apparatus includes a display substrate, first micro LED modules arranged on the display substrate, and at least one second micro LED module disposed between the first micro LED modules. Each of the first micro LED module includes a first substrate and micro LEDs disposed on the first substrate. The second micro LED module includes a second substrate, and micro LEDs disposed on the second substrate. The first substrate includes a lower body and a top plate located on the lower body. The lower body is recessed from an edge of the top plate, and the second micro LED module is disposed between recessed lower bodies of adjacent first micro LED modules.

As the second micro LED module is disposed between the first micro LED modules, a linear defect observed when arranging the micro LED modules may be reduced.

The second substrate may be partially overlapped with each of the top plates of two adjacent first substrates.

A portion of the micro LEDs disposed on the first substrate may be spaced apart from an upper region of the lower body and disposed on the top plate.

In addition, at least one of the micro LEDs disposed on the second substrate may be disposed in a lower region of the top plate of the first substrate, and may emit light through the top plate of the first substrate.

At least one of the micro LEDs disposed on the second substrate may be disposed under a region between top plates of the first substrate, and may emit light through a region between the first substrates.

The display apparatus may further include a molding member covering the first and second micro LED modules.

The first micro LED module may further include a first connector connecting an interconnection on an upper surface of the first substrate and an interconnection on a lower surface thereof.

In an exemplary embodiment, the top plate and the lower body may have a quadrangular shape, and the lower body may be recessed from at least two edges of the top plate.

The first micro LED modules may include a plurality of pixel regions, respectively, and the second micro LED module may include a plurality of pixel regions.

Each of the pixel regions may be configured to emit red light, green light, and blue light.

The display apparatus may include: a second micro LED module disposed in a row direction of the first micro LED module; and a second micro LED module disposed in a column direction of the first micro LED module.

One of the second micro LED modules may be disposed at an intersection formed by the first micro LED modules.

A micro LED module according to one or more exemplary embodiments includes a first substrate, and micro LEDs disposed on the first substrate. The first substrate includes a lower body and a top plate disposed on the lower body, and the lower body is recessed from an edge of the top plate.

The top plate and the lower body may have a quadrangular shape, and the lower body may be recessed from at least two edges of the top plate.

A portion of the micro LEDs disposed on the first substrate may be spaced apart from an upper region of the lower body and disposed on the top plate.

The micro LED module may include a plurality of pixel regions emitting red light, green light, and blue light on the first substrate, respectively.

In an exemplary embodiment, each of the micro LEDs may be configured to emit red light, green light, and blue light.

Hereinafter, exemplary embodiments will be described in detail with reference to the accompanying drawings.

Figure 4:
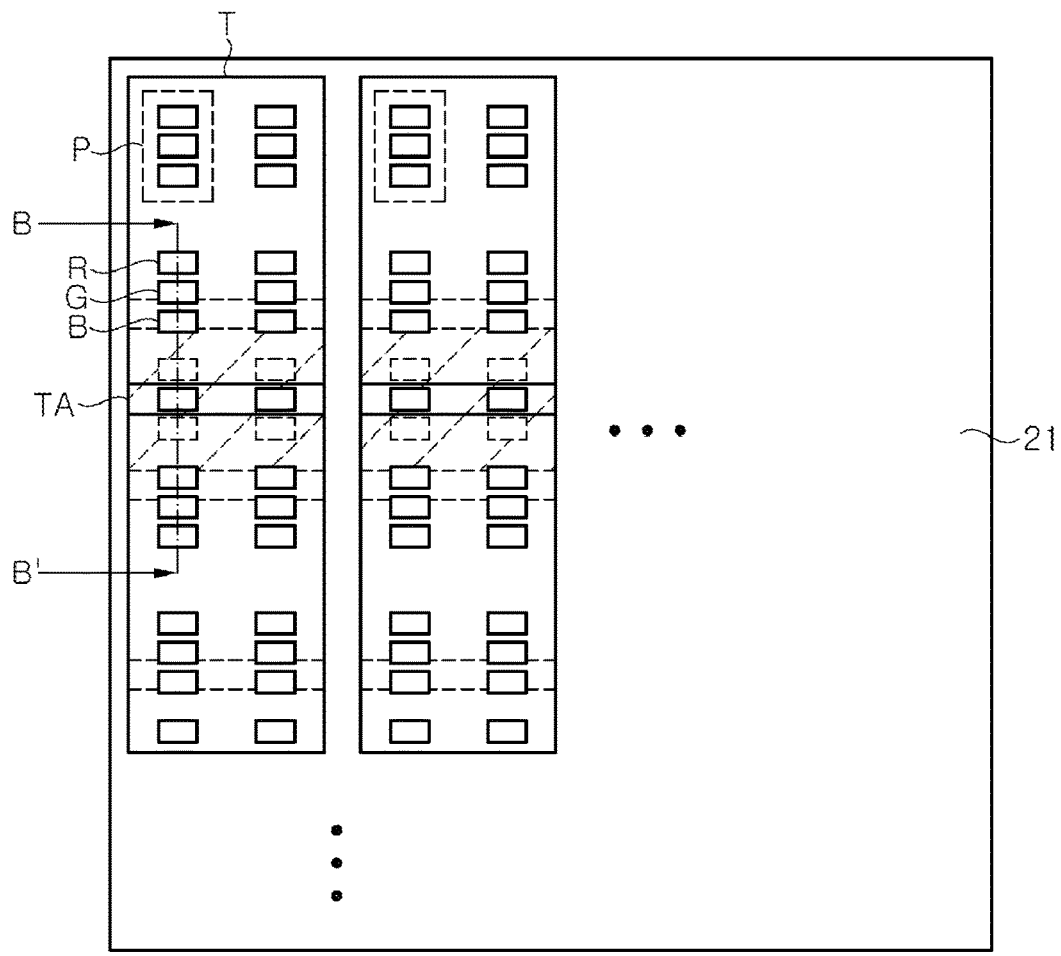
FIG. 4 is a schematic plan view illustrating a display apparatus including micro LED modules according to one or more exemplary embodiments.
Figure 5:
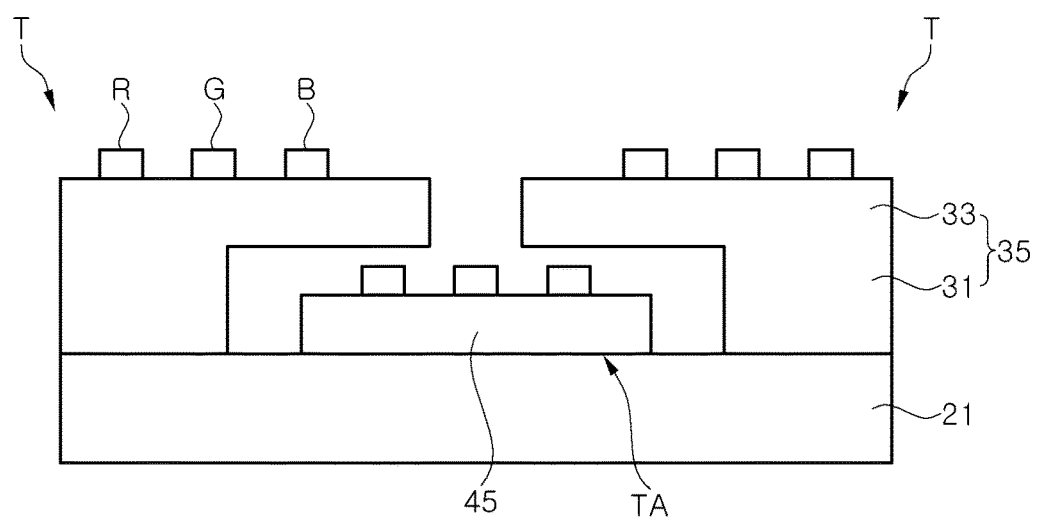
FIG. 5 is a schematic partial cross-sectional view taken along line B-B' of FIG. 4.

FIG. 4 is a schematic plan view illustrating a display apparatus including micro LED modules according to one or more exemplary embodiments, and FIG. 5 is a schematic partial cross-sectional view taken along line B-B' of FIG. 4.

Referring to FIGS. 4 and 5, a display apparatus 100 includes a display substrate 21, first micro LED modules T, and a second micro LED module TA. The first and second micro LED modules T and TA may include a plurality of pixels P, and each of the pixels P may include micro LEDs R, G, and B.

The display apparatus 100 is a micro LED display apparatus, and a light emitting area of one sub-pixel may be 10,000 $\mu m^2$ or less in some embodiments. More specifically, the light emitting area of one sub-pixel may be, by way of example, 4,000 $\mu m^2$ or less, and in other embodiments, 1,000 $\mu m^2$ or less.

The display substrate 21 is used to support the first and second micro LED modules T and TA, and is not particularly limited as long as it is capable of securing them. In the illustrated exemplary embodiment, the display substrate 21 may be a circuit board including a circuit such as a TFT, but the inventive concepts are not limited thereto, and may be a substrate without a circuit, for example, a glass substrate. The display substrate 21 may have a size corresponding to a size of a screen of the display apparatus 100, but the inventive concepts are not limited thereto.

The display substrate 21 may be, for example, glass, quartz, ceramic, Si, SiC, metal, fiber, polymer, or the like, and may be a transparent or opaque substrate. In addition, the display substrate 21 may be a rigid or flexible PCB (printed circuit board).

In an exemplary embodiment, the display substrate 21 may be a transparent substrate such as glass, quartz, transparent ceramic, transparent film, and transparent PCB. The transparent film may be, for example, PEN (Poly Ethylene Naphthalene), PET (Poly Ethylene Terephthalate), PI (Polyimide), PE (Poly Ethylene) film, PMMA (Poly Methyl Methacrylate), or the like.

An interconnection portion on the display substrate 21 may also be formed of a transparent film such as a transparent conductive oxide film or a transparent conductive layer such as carbon nanotubes or carbon graphite, but the inventive concepts are not limited thereto. When the display substrate 21 is a transparent substrate, a background structure or setting of the display apparatus can be observed through the display substrate 21 before the display apparatus is turned on. For example, when the display substrate 21 is attached to a wall, a display screen can be hardly observed and a wall surface can be observed through the display screen. As the micro LEDs R, G and B have a very small size, the background can be observed through a region between the micro LEDs R, G and B. Accordingly, a transparent display apparatus, for example, a head-up display may be provided in some embodiments.

Furthermore, in some embodiments, when the display substrate 21 is formed of a flexible plastic, a flexible display may be implemented.

In an exemplary embodiment, the transparent display apparatus may use a glass plate such as window glass of a building or automobile glass as the display substrate 21.

In another exemplary embodiment, the transparent display apparatus may be manufactured using a transparent printed circuit board as the display substrate 21, and the transparent display apparatus may be attached to the glass plate such as window glass or automobile glass.

In another exemplary embodiment, a flexible printed circuit board (FPCB) may be used as the display substrate 21 to manufacture a flexible display apparatus, and the flexible display apparatus may be attached to the glass plate such as window glass or automobile glass, or the flexible display apparatus may be used instead of the glass plate.

In a particular exemplary embodiment, the glass plate such as window glass or automobile glass or a transparent display substrate may be manufactured to have electrochromic characteristics, and light transmittance thereof may be adjusted by controlling current and voltage. In addition, transparency of the display substrate 21 may be adjusted by controlling an amount of light emitted from the micro LEDs R, G, and B in each pixel.

The first micro LED modules T are arranged on the display substrate 21. The first micro LED modules T may be attached on the display substrate 21 using a tiling technique. The first micro LED modules T may be arranged to be spaced apart from one another.

The first micro LED module T may include a plurality of pixels P disposed on a first substrate 35, and the pixel P may include micro LEDs R, G, and B. The first substrate 35 may have substantially flat upper and lower surfaces. The first substrate 35 may have the upper surface wider than the lower surface. For example, the first substrate 35 may include a lower body 31 and a top plate 33, and the lower body 31 may have a smaller area than the top plate 33. In particular, the lower body 31 is recessed at an edge of the top plate 33.

The first substrate 35 is formed of a transparent material. In particular, the top plate 33 of the first substrate 35 may be formed of a material transparent to visible light, for example, glass. The top plate 33 may be integrally formed with the lower body 31, but the inventive concept is not necessarily limited thereto. The lower body 31 may be formed of an opaque material.

The micro LEDs R, G, and B may emit red light, green light, and blue light, respectively. In the present specification, the micro LED refers to a micro-scale luminous body manufactured using an inorganic semiconductor layer. The micro LED may generally include a first conductivity type semiconductor layer, an active layer, and a second conductivity type semiconductor layer. A structure of the micro LED may be various, such as a vertical type, a lateral type, and a flip chip type, and the inventive concepts are not particularly limited to a specific type. As available in the art, electrodes, pads, and an insulation layer for electrical connection to the micro LED may be additionally formed.

Each of the micro LEDs R, G, and B may constitute a sub-pixel, and sub-pixels arranged laterally to one another may constitute a single pixel P. In another exemplary embodiment, a stacked light emitting device in which micro LEDs R, G, and B are stacked one above another may constitute a single pixel. The stacked light emitting device may include micro LEDs emitting red light, green light, and blue light, and these micro LEDs (e.g., 60 in FIG. 9B) may constitute a sub-pixel, respectively.

The first micro LED modules T are arranged to be spaced apart from one another. In particular, the recessed lower bodies 31 of the first micro LED modules T are spaced apart to face one another. As such, a space is formed under the top plates 33 by recessed regions of the lower bodies 31. A portion of the micro LEDs R, G, and B may be disposed over the recessed region of the lower body 31.

Meanwhile, the second micro LED module TA may include a second substrate 45 and at least one pixel P disposed on the second substrate 45, and the pixel P may include micro LEDs R, G, and B. The second micro LED module TA is disposed between the first micro LED modules T. In particular, as shown in FIG. 5, the second micro LED module TA may be disposed in the space formed by the recessed regions of the lower bodies 31. Accordingly, the second micro LED module TA is disposed under the top plate 33 of the first micro LED modules T. The second substrate 45 may be disposed to partially overlap with the adjacent first substrates 35.

Materials of the first substrate 35 and the second substrate 45 are not particularly limited, but the first substrate 35 and the second substrate 45 may be a transparent or opaque substrate. In an exemplary embodiment, the first substrate 35 and the second substrate 45 may be a transparent substrate formed of a transparent material to provide a transparent display apparatus. The first substrate 35 and the second substrate 45 may be, for example, the transparent substrate described with respect to the display substrate 21, and the descriptions for the display substrate 21 are applied.

The micro LEDs R, G, and B on the second substrate 45 may have an identical structure and an identical size to one another as the micro LEDs on the first substrate 35, but the inventive concepts are not limited thereto. The micro LEDs R, G, and B may emit red light, green light, and blue light, respectively. Each of the micro LEDs R, G, and B may constitute a sub-pixel, and sub-pixels arranged laterally to one another may constitute a single pixel P. In another exemplary embodiment, a stacked light emitting device may constitute a single pixel P. The stacked light emitting device may include semiconductor stacks that emit red light, green light, and blue light, respectively, and these semiconductor stacks may constitute sub-pixels, respectively.

At least one (e.g., R or B) of the micro LEDs R, G, and B on the second micro LED module TA may be disposed under the top plate 33 of the first micro LED module T, and may emit light through the top plate 33. A portion (e.g., G) of the micro LEDs R, G, and B may be disposed under a region between the top plates 33, and thus, may emit light through the region between the top plates 33.

According to the illustrated exemplary embodiment, by disposing the second micro LED module TA between the first micro LED modules T, a linear defect observed between the first micro LED modules T may be reduced.

Figure 6A:
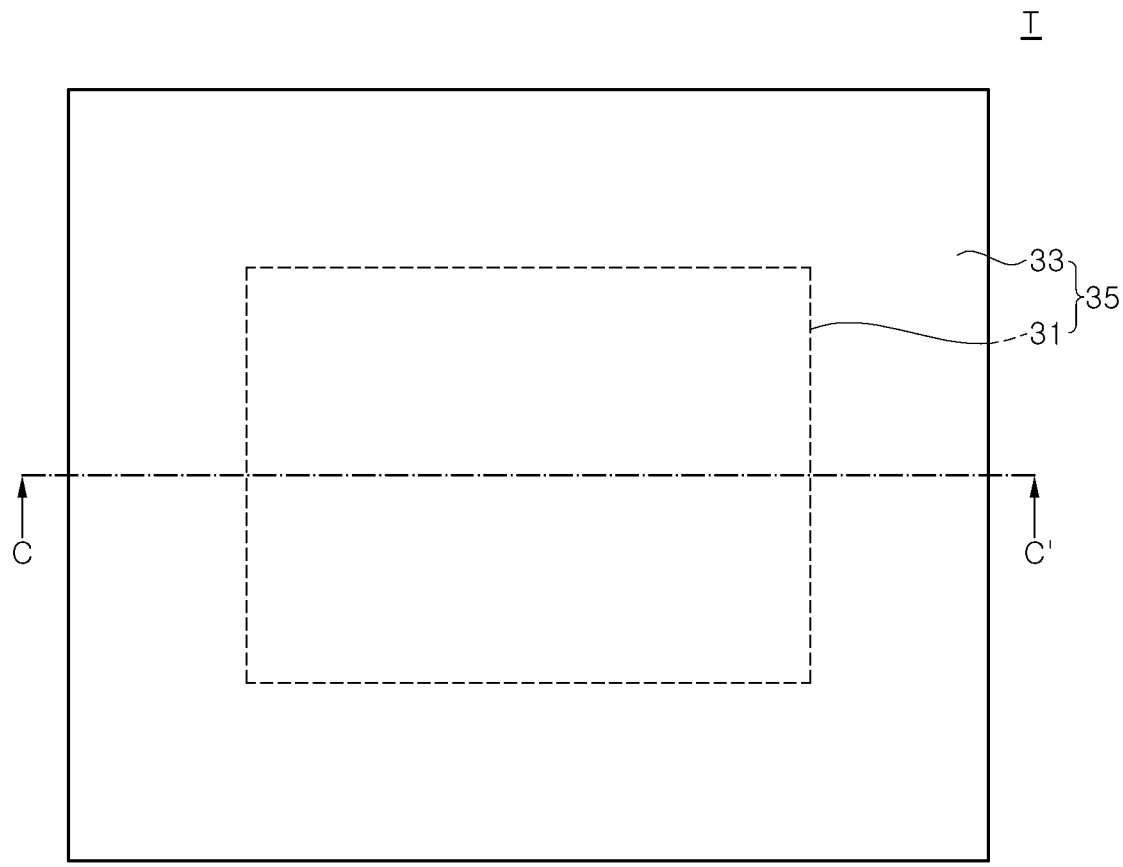
FIG. 6A is a schematic plan view illustrating a first micro LED module.
Figure 6B:
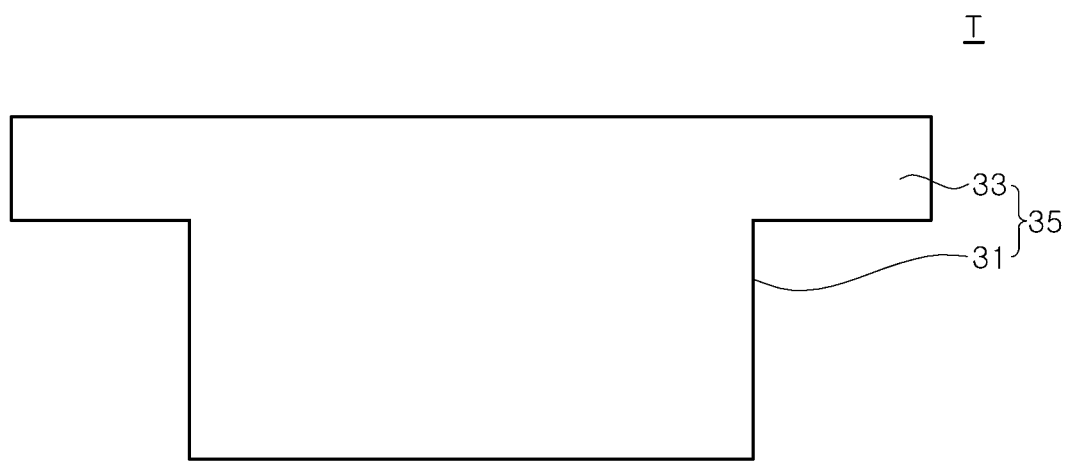
FIG. 6B is a schematic cross-sectional view taken along line C-C' of FIG. 6A.

FIG. 6A is a schematic plan view illustrating a first micro LED module T according to one or more exemplary embodiments, and FIG. 6B is a schematic cross-sectional view taken along line C-C' of FIG. 6A.

Referring to FIGS. 6A and 6B, the first micro LED module T includes a first substrate 35 and micro LEDs (not shown in the drawing) arranged on the first substrate 35. The first substrate 35 includes a lower body 31 and a top plate 33.

As shown in FIG. 6A, the lower body 31 has a relatively small area compared to that of the top plate 33 In particular, the lower body 31 has a shape recessed from an edge of the top plate 33. As shown in FIG. 6A, the lower body 31 and the top plate 1 may have a quadrangular shape, and the lower body 31 may be recessed inwardly from four edges of the top plate 33. However, the inventive concepts are not limited thereto, and the lower body 31 may be recessed from three edges, two edges, or any one of the edges of the top plate 33.

Meanwhile, first micro LEDs R, G, and B on the first micro LED module T may be electrically connected to pads on the first substrate 35, and these pads may be electrically connected to a driver(s)(not shown) for driving the first micro LEDs R, G, and B. The driver may be disposed on the display substrate 21, but the inventive concepts are not limited thereto. In particular, when a plurality of first micro LED modules T is arranged, the drivers for driving each of the first micro LED modules T may be provided on the first substrate 35. In this case, the driver may be disposed on a rear surface of the first substrate 35, and the pads thereof may be electrically connected to the driver through electrical interconnection.

Various techniques for electrically connecting the first micro LEDs R, G, and B disposed on the first substrate 35 to the driver disposed on the rear surface of the first substrate 35 may be used, which will be described with reference to FIGS. 7A and 7B.

Figure 7A:
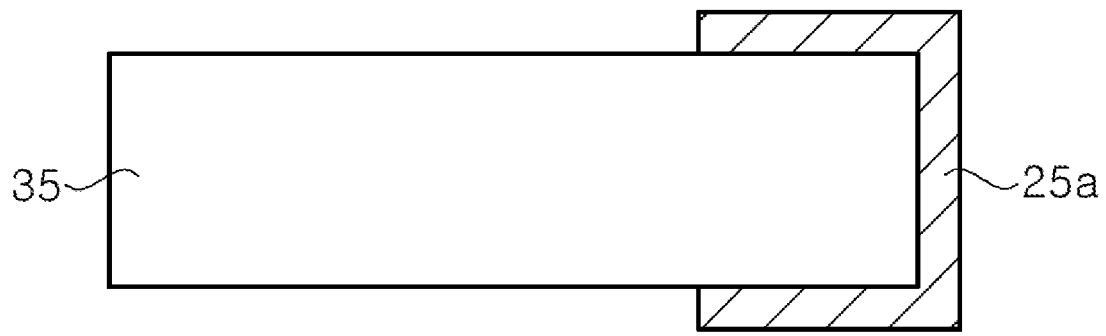
FIG. 7A is a schematic cross-sectional view illustrating a connector of a micro LED module according to one or more exemplary embodiments.

FIG. 7A is a schematic cross-sectional view illustrating a connector 25a of a first micro LED module T according to one or more exemplary embodiments.

Referring to FIG. 7A, the connector 25a connecting an upper surface of a first substrate 35 and a lower surface thereof may be disposed on a side surface of the first substrate 35. A driver (not shown in the drawing) is disposed on the lower surface of the first substrate 35, and for example, a scan driver for driving a scan line and a data driver for driving a data line may be disposed.

Micro LEDs R, G, and B on the first substrate 35 may be electrically connected to the driver, and may be driven by the driver. In this case, to electrically connect the micro LEDs R, G, and B disposed on the first substrate 35 to the driver, the interconnection on the upper surface and the interconnection on lower surface of the first substrate 35 may be connected through the connector 25a. A plurality of interconnections is disposed on the upper and lower surfaces of the first substrate 35, and thus, a plurality of connectors 25a is provided on the first substrate 35.

Figure 7B:
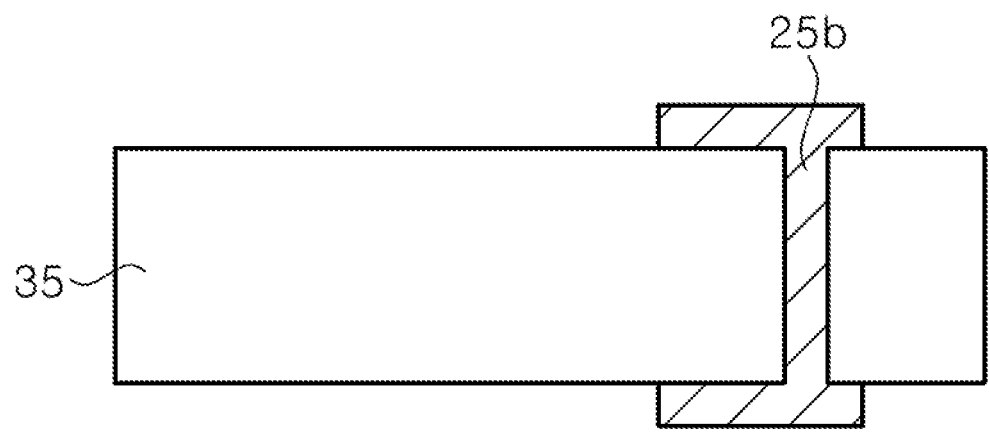
FIG. 7B is a schematic cross-sectional view illustrating another connector of a micro LED module according to another exemplary embodiment.

FIG. 7B is a schematic cross-sectional view illustrating a connector 25b of a first micro LED module T according to one or more exemplary embodiments.

Referring to FIG. 7B, the connector 25b in the illustrated exemplary embodiment is substantially similar to the connector 25a described with reference to FIG. 7A, but the connector 25b is formed in a through hole passing through the first substrate 35. The connector 25b may be formed near an edge of the first substrate 35.

Meanwhile, referring back to FIG. 5, a second micro LED module TA may include micro LEDs R, G, and B disposed on a second substrate 45, and interconnections are needed to electrically connect the micro LEDs R, G, and B and a driver to drive the micro LEDs R, G, and B. To this end, the connector 25a or 25b as described above may be provided on the second substrate 45.

Figure 8:
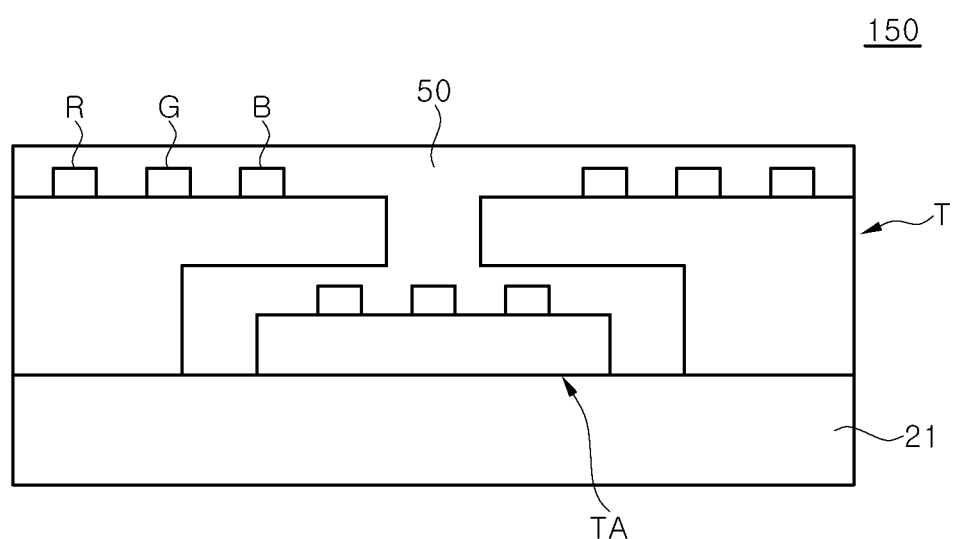
FIG. 8 is a schematic partial cross-sectional view illustrating a display apparatus according to one or more exemplary embodiments.

FIG. 8 is a schematic partial cross-sectional view illustrating a display apparatus 150 according to one or more exemplary embodiments.

Referring to FIG. 8, the display apparatus 150 according to the exemplary embodiment is substantially similar to the display apparatus 100 described with reference to FIGS. 4 and 5 above, but the display apparatus further includes a molding member 50.

The molding member 50 covers micro LEDs R, G, and B on first micro LED modules T and a second micro LED module TA. The molding member 50 may cover all of the micro LED modules T and TA on a display substrate 21. The molding member 50 may be formed of a transparent resin or may be a black molding having a light absorbing function. The black molding increases a contrast ratio and improves the quality of a final product.

Figure 9A:
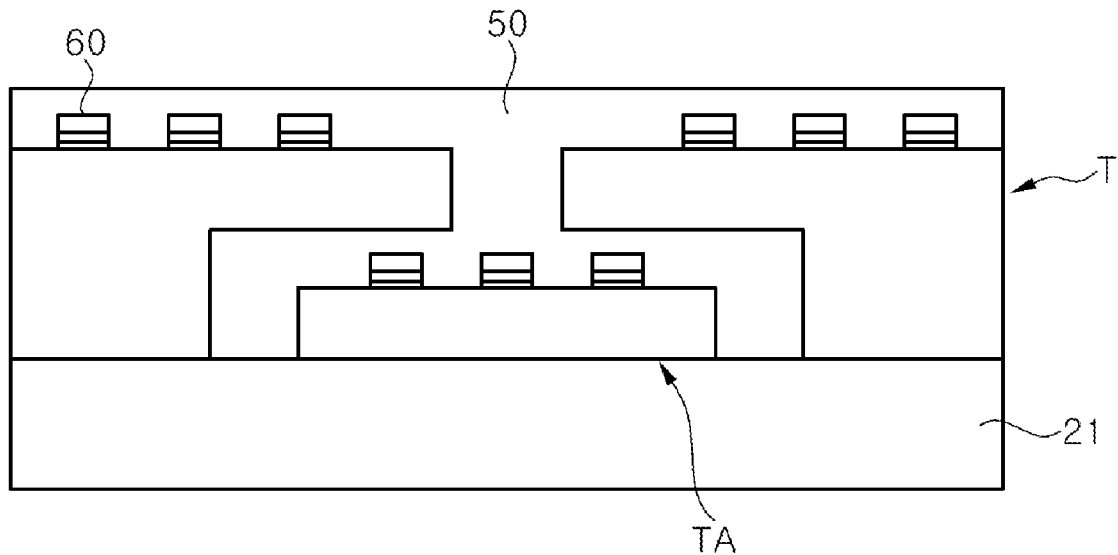
FIG. 9A is a schematic partial cross-sectional view illustrating a display apparatus according to one or more exemplary embodiments.
Figure 9B:
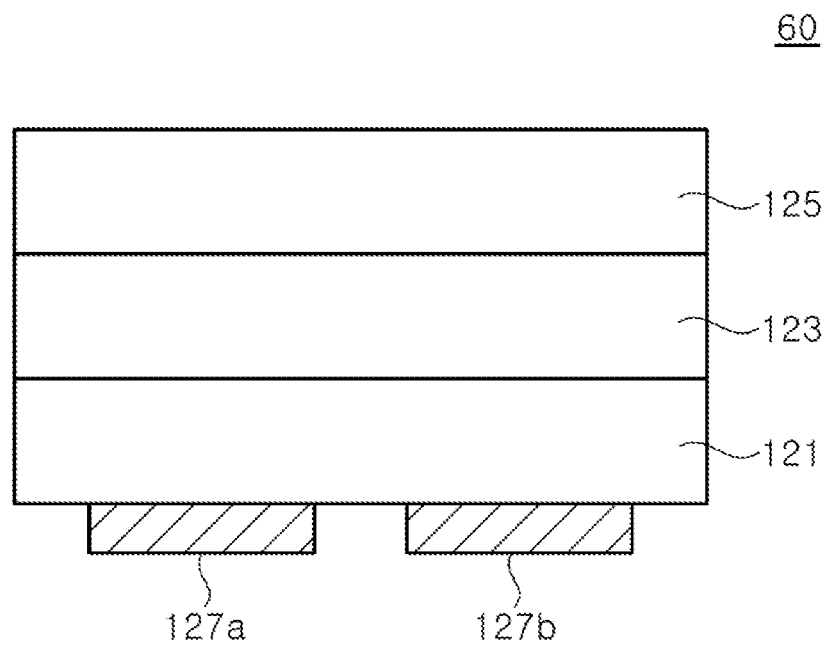
FIG. 9B is a schematic cross-sectional view illustrating a micro LED disposed in the display apparatus of FIG. 9A.

FIG. 9A is a schematic partial cross-sectional view illustrating a display apparatus according to one or more exemplary embodiments, and FIG. 9B is an enlarged cross-sectional view of a micro LED 60 of FIG. 9A.

Referring to FIGS. 9A and 9B, the display apparatus according to the exemplary embodiment is substantially similar to the display apparatus described with reference to FIG. 8, but the micro LED 60 has a stacked structure. More particularly, in the exemplary embodiment of FIG. 8, the micro LEDs R, G, B are arranged on the first and second substrates 35 and 45, and the red, green, and blue micro LEDs R, G, B constitutes one pixel P. However, in this exemplary embodiment, the micro LED 60 includes a red LED 121, a blue LED 123, and a green LED 125, and these LEDs 121, 123, and 125 are vertically stacked. The blue LED 123 and the green LED 125 may change locations with each other. These LEDs 121, 123, and 125 may be stacked one above another using a transparent adhesive. Meanwhile, although not shown in the drawing, a support substrate may be added over the green LED 125 or under the red LED 121.

In addition, the micro LED 60 may include bonding pads 127a and 127b. Herein, two bonding pads 127a and 127b are shown, but at least four bonding pads may be disposed under the micro LED 60. These bonding pads may be electrically connected to anodes and cathodes of the LEDs 121, 123, and 125 to independently drive the LEDs 121, 123, and 125. The micro LED 60 may be bonded on the first and second substrates 35 and 45 using the bonding pads 127a and 127b.

Figure 10:
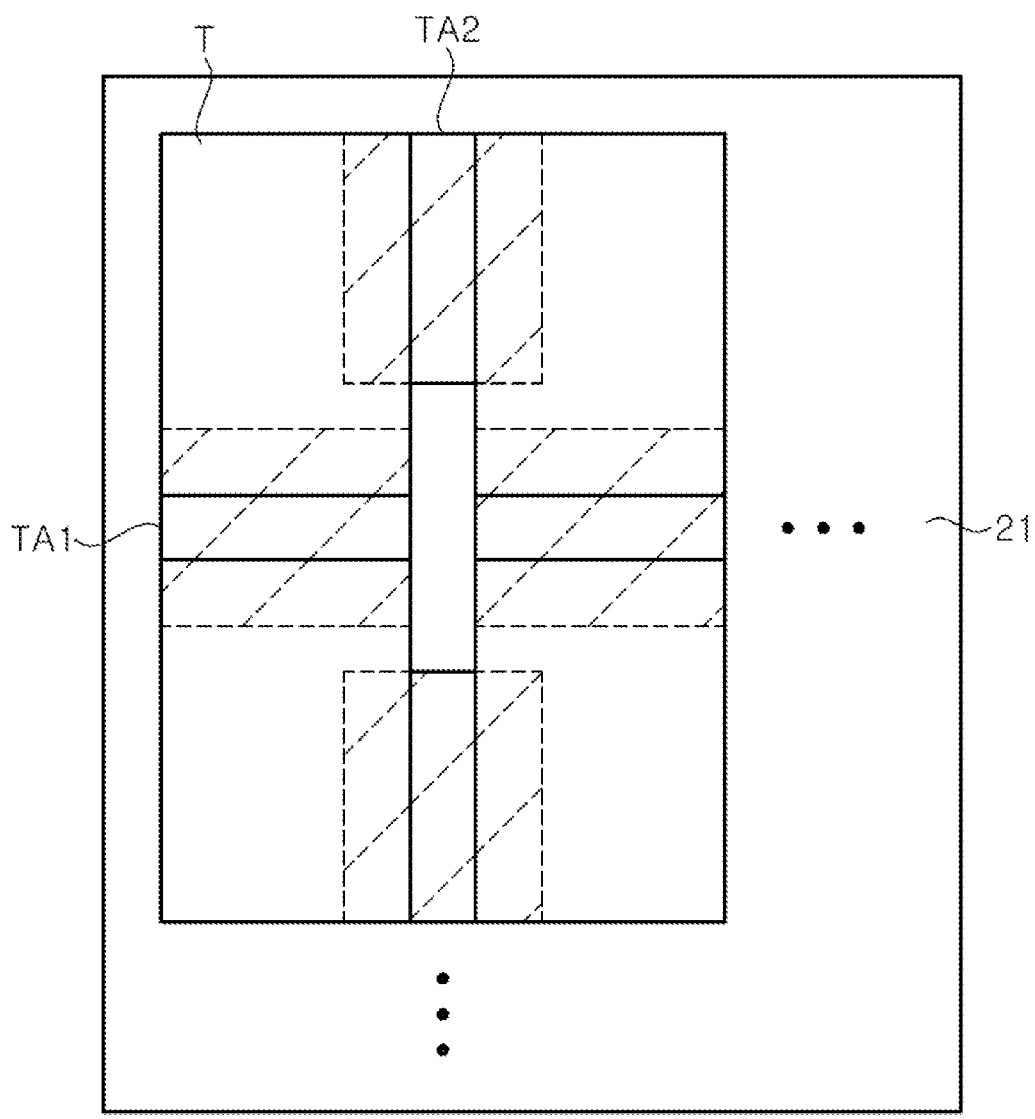
FIG. 10 is a schematic plan view illustrating a display apparatus according to one or more exemplary embodiments.

FIG. 10 is a schematic plan view illustrating a display apparatus 200 according to one or more exemplary embodiments.

Referring to FIG. 10, the display apparatus 200 according to the exemplary embodiment is substantially similar to the display apparatus 100 described with reference to FIGS. 4 and 5, but second micro LED modules TA1 and TA2 are arranged in a column direction and a row direction of first micro LED modules T.

The second micro LED module TA1 is disposed between adjacent first micro LED modules T arranged in the column direction of the first micro LED modules T, and the second micro LED module TA2 is disposed between the adjacent first micro LED modules T arranged in the row direction of the first micro LED modules T.

According to the illustrated exemplary embodiment, a linear defect observed on a screen may be drastically reduced by disposing the second micro LED modules TA1 and TA2.

Figure 11:
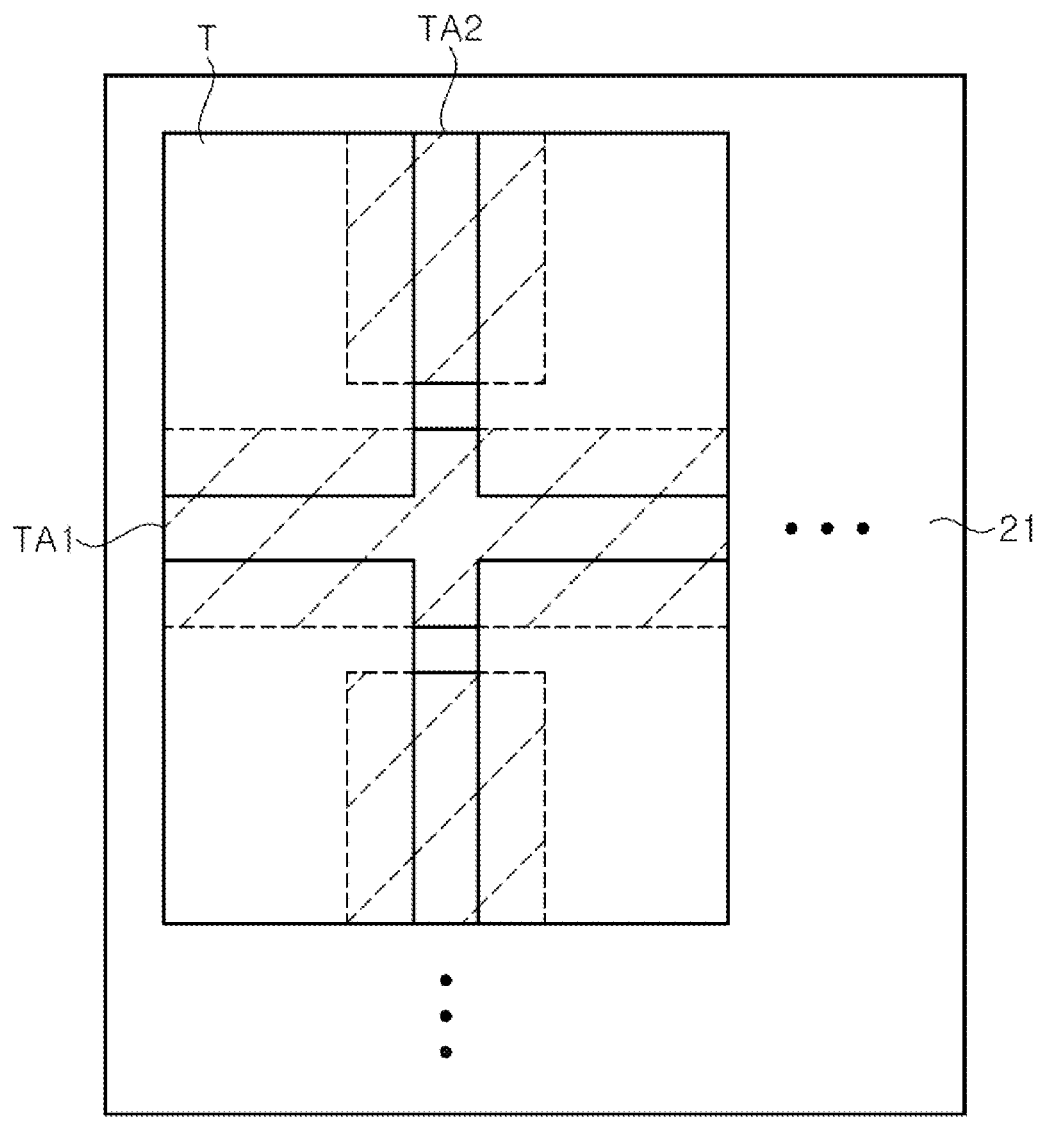
FIG. 11 is a schematic plan view illustrating a display apparatus according to one or more exemplary embodiments.

FIG. 11 is a schematic plan view illustrating a display apparatus 300 according to one or more exemplary embodiments.

Referring to FIG. 11, the display apparatus 300 according to the exemplary embodiment is substantially similar to the display apparatus 200 of FIG. 10, but a second micro LED module TA1 is disposed over a plurality of rows of first micro LED modules T. The second micro LED module TA1 may also be disposed at an intersection formed by the first micro LED modules T, and thus, a linear defect observed on a screen may be further reduced.

Figure 12:
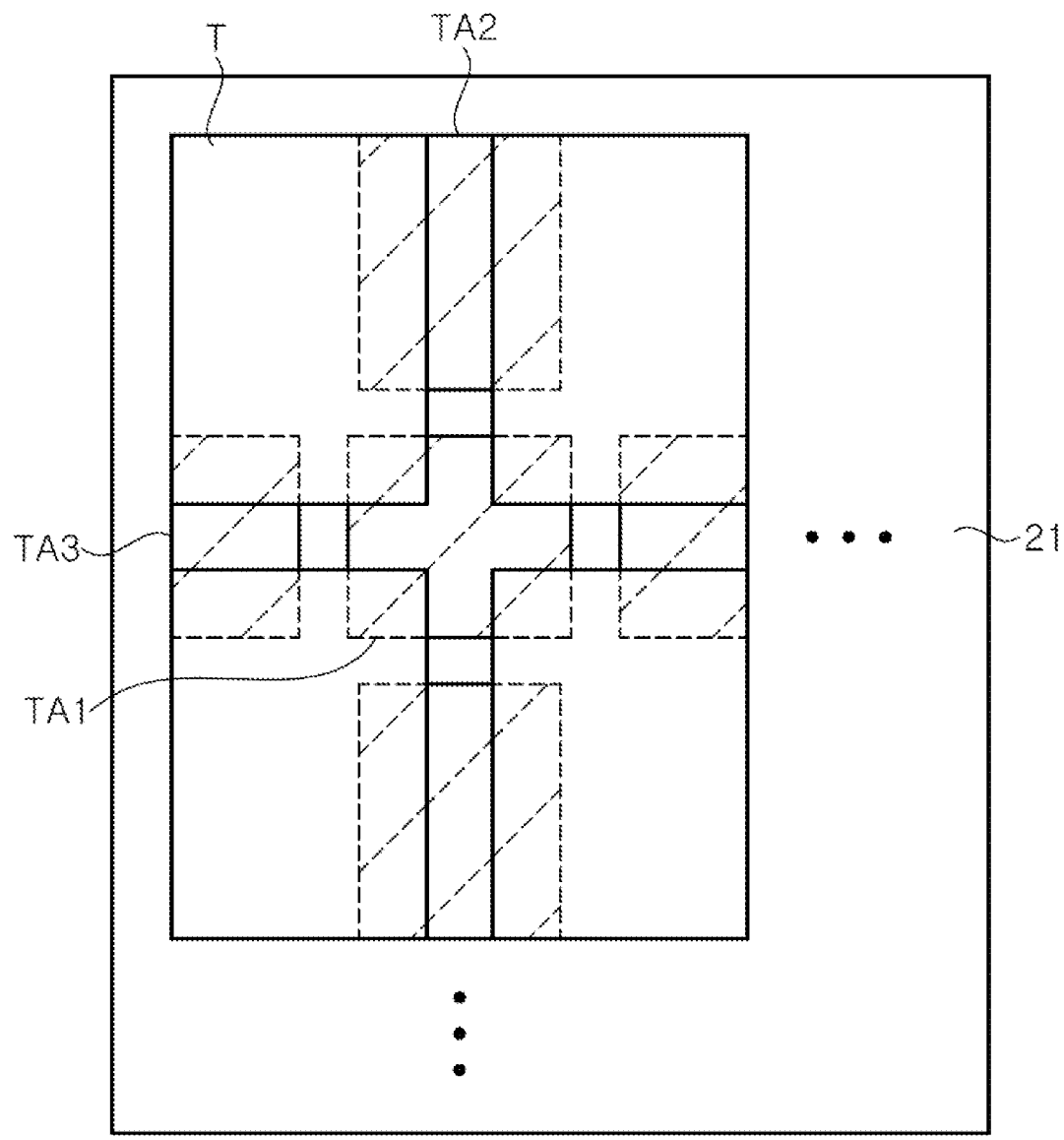
FIG. 12 is a schematic plan view illustrating a display apparatus according to one or more exemplary embodiments.

FIG. 12 is a schematic plan view illustrating a display apparatus 400 according to one or more exemplary embodiments.

Referring to FIG. 12, the display apparatus 400 according to the exemplary embodiment is substantially similar to the display apparatus 300 described above, but the display device 400 further includes a second LED module TA3 disposed in the row direction of the first micro LED modules T besides the second micro LED module TA1 disposed at the intersection formed by the first micro LED modules T.

The first micro LED module T and the second micro LED module TA may have various shapes, and may be arranged in various ways. In the above exemplary embodiments, the first micro LEDs T are exemplarily illustrated and described as being arranged in a matrix form, but the first micro LEDs T are not limited to being arranged in rows and columns parallel to one another. For example, the first micro LED modules T may be arranged to be staggered with one another, and the second micro LED modules TA may be disposed between the first micro LED modules T.

Although some embodiments have been described herein, it should be understood that these embodiments are provided for illustration only and are not to be construed in any way as limiting the present disclosure. It should be understood that features or components of an exemplary embodiment can also be applied to other embodiments without departing from the spirit and scope of the present disclosure.

The invention claimed is:

1. A display apparatus, comprising:
a display substrate;
first micro LED modules arranged on the display substrate; and
at least one second micro LED module disposed between the first micro LED modules, wherein:
each of the first micro LED modules includes a first substrate, and a first set of micro LEDs disposed on the first substrate, the first substrate includes a lower body and a top plate located on the lower body, the lower body configured to be recessed from an edge of the top plate,
the at least one second micro LED module includes a second substrate, and a second set of micro LEDs disposed on the second substrate,
the at least one second micro LED module is disposed between recessed lower bodies of adjacent first micro LED modules.

2. The display apparatus of claim 1, further comprising:
a molding member covering the first micro LED modules and the at least one second micro LED module.

3. The display apparatus of claim 1, further comprising:
a first connector connecting an upper surface of the first substrate and a lower surface thereof.

4. The display apparatus of claim 1,
wherein the top plate and the lower body have a quadrangular shape, and the lower body is recessed from at least two edges of the top plate.

5. The display apparatus of claim 1, wherein:
the first micro LED modules include a plurality of pixel regions, respectively, and
the at least one second micro LED module includes a plurality of pixel regions.

6. The display apparatus of claim 5,
wherein each of the plurality of pixel regions is configured to emit red light, green light, and blue light.

7. The display apparatus of claim 1,
wherein the at least one second micro LED module further comprises two or more second micro LED modules;
one of the two or more second micro LED modules disposed in a row direction of a first micro LED module; and
another of the two or more second micro LED modules disposed in a column direction of the first micro LED module.

8. The display apparatus of claim 7, wherein the one of the two or more second micro LED modules is disposed at an intersection formed by the first micro LED modules.

9. The display apparatus of claim 1,
wherein the second substrate partially overlap with each of the top plates of two adjacent first substrates.

10. The display apparatus of claim 9,
wherein a portion of the first set of micro LEDs is disposed on the top plate of the first substrate and spaced apart from an upper region of the lower body.

11. The display apparatus of claim 10,
wherein at least one of the second set of micro LEDs disposed on the second substrate is disposed in a lower region of the top plate of the first substrate, and emits light through the top plate of the first substrate.

12. The display apparatus of claim 10,
wherein at least one of the second set of micro LEDs disposed on the second substrate is disposed under a region between top plates of the first substrate, and emits light through a region between first substrates.

13. A display apparatus comprising a micro LED module, the micro LED module comprising:
a first substrate; and
micro LEDs disposed on the first substrate, wherein:
the first substrate includes a lower body and a top plate located on the lower body,
the lower body is recessed from an edge of the top plate, and
the top plate and the lower body have a quadrangular shape, and the lower body is recessed from at least two edges of the top plate.

14. The display apparatus of claim 13,
wherein a portion of the micro LEDs disposed on the first substrate is spaced apart from an upper region of the lower body and disposed on the top plate.

15. The display apparatus of claim 13, further comprising:
a first connector connecting an upper surface of the first substrate and a lower surface of the first substrate.

16. The display apparatus of claim 13, wherein the first substrate has an upper surface that has a size greater than a size of a lower surface of the first substrate.

17. The display apparatus of claim 13, comprising:
a plurality of pixel regions emitting red light, green light, and blue light on the first substrate, respectively.

18. The display apparatus of claim 17,
wherein the micro LEDs are configured to emit red light, green light, and blue light, respectively.

19. The display apparatus of claim 13, further comprising:
a second substrate disposed to overlap with the first substrate,
wherein additional micro LEDs are disposed on the second substrate.

20. The display apparatus of claim 19, wherein the additional micro LEDs are configured to emit red light, green light, and blue light, respectively.

* * * * *